US012796281B1

(12) United States Patent
Jager et al.

(10) Patent No.: US 12,796,281 B1
(45) Date of Patent: Nov. 10, 2026

(54) WINDOW OVERLAY

(71) Applicant: Zumedia Inc., New York, NY (US)

(72) Inventors: Phyllis Jager, New York, NY (US); Barry Terach, Goshen, NY (US); Mark Cuban, Dallas, TX (US)

(73) Assignee: Zumedia Inc., New York, NY (US)

( * ) Notice: Subject to any disclaimer, the term of this patent is extended or adjusted under 35 U.S.C. 154(b) by 0 days.

(21) Appl. No.: 19/631,912

(22) Filed: Mar. 27, 2026

(51) Int. Cl.

| | |
|---|---|
| ***H10K 59/60*** | (2023.01) |
| ***H02S 40/38*** | (2014.01) |
| ***H05B 47/17*** | (2020.01) |
| ***H10K 30/50*** | (2023.01) |
| ***H10K 59/80*** | (2023.01) |

(52) U.S. Cl.
CPC ............. *H10K 59/60* (2023.02); *H02S 40/38* (2014.12); *H05B 47/172* (2024.01); *H10K 30/50* (2023.02); *H10K 59/873* (2023.02)

(58) Field of Classification Search
CPC ...... H10K 59/60; H10K 59/873; H10K 30/50; H05B 47/172; H02S 40/38
See application file for complete search history.

(56) References Cited

U.S. PATENT DOCUMENTS

| | | | | |
|---|---|---|---|---|
| 7,972,048 | B1 | 7/2011 | Lamborn | |
| 11,784,267 | B2 * | 10/2023 | Ren | H02J 7/35 136/251 |
| 2016/0359451 | A1 * | 12/2016 | Mao | H02S 20/23 |
| 2018/0062558 | A1 * | 3/2018 | Muralidharan | H02S 20/30 |

* cited by examiner

*Primary Examiner* — Alonzo Chambliss
(74) *Attorney, Agent, or Firm* — Tarter Krinsky & Drogin LLP

(57) ABSTRACT

A transparent, adhesive, cut-to-fit window overlay for solar-powered illumination and method of use. The overlay comprising: a transparent photovoltaic layer with AVT≥70% and PCE≥8%; a thin-film energy storage layer electrically coupled thereto, with energy density ≥1 $Wh/cm^3$ and AVT≥70%; a transparent illumination layer electrically coupled to the storage layer, emitting ≥100 $lm/m^2$ at efficacy ≥80 lm/W with off-state AVT≥70%; a light sensor and microcontroller to activate illumination in low-light; an optically clear adhesive layer for glass adhesion; protective encapsulation with WVTR<$10^{-6}$ $g/m^2$/day; wherein the overlay is flexible, cuttable, and has total AVT≥40%. The method comprising applying to a surface the overlay; generating and storing energy during a period of light; detecting low light; activating the illumination layer; and maintaining an AVT of less than or equal to 40%.

11 Claims, 3 Drawing Sheets

100

WINDOW OVERLAY

FIELD OF THE DISCLOSURE

The present technology relates to renewable energy devices, energy-efficient lighting, and building-integrated photovoltaics. Specifically, it concerns a flexible, transparent, adhesive film for application to windows or doors, integrating transparent photovoltaic cells, thin-film energy storage, and illumination to enable solar-powered nighttime and emergency lighting while preserving aesthetic transparency.

BACKGROUND

Demand for sustainable energy and efficient lighting drives advancements in transparent photovoltaics (e.g., perovskite, organic PV) and low-power displays (e.g., OLEDs). Semi-transparent solar technologies achieve 8-15% power conversion efficiency (PCE) with 40-70% average visible transmittance (AVT), enabling power generation from windows. OLEDs offer 80-100 lm/W efficacy with high off-state transparency.

Existing sustainable energy and efficient lighting remain fragmented. Discrete solar night lights lack transparency and full coverage. Transparent solar windows or solar window coatings (e.g., Ubiquitous Energy UE Power, Heliatek HeliaSol adhesive OPV films, SolarWindow Technologies) focus on power generation without integrated storage or illumination. Solar control/adhesive films (e.g., 3M, Llumar, Lintec recycled PET films) provide UV/heat rejection but no electricity generation or lighting. Switchable smart films (e.g., PDLC/electrochromic) offer privacy or tinting but require external power and lack solar harvesting or self-illumination. Edge-concentrator or lab prototypes (e.g., 2025 Nanjing University cholesteric coatings) redirect light for PV but omit on-film storage and automatic OLED lighting. The current technology integrates wavelength-selective PV, transparent thin-film storage, and auto-activated transparent OLED illumination into a single, user-installable, cut-to-fit adhesive overlay for self-contained nighttime/emergency use.

SUMMARY

The present disclosure, according to certain embodiments is directed to a window overlay, comprising: a photovoltaic layer with AVT≥70% and PCE≥8%; a thin-film energy storage layer electrically coupled to the photovoltaic layer, with energy density ≥1 Wh/cm$^3$ and AVT≥70%; a illumination layer electrically coupled to the storage layer, emitting ≥100 lm/m$^2$ at efficacy ≥80 lm/W with off-state AVT 70%; a processor to activate illumination in low-light; an adhesive layer for glass adhesion; protective encapsulation with WVTR<10$^{-6}$ g/m$^2$/day; wherein the overlay is flexible, cuttable, and has total AVT≥40%.

The present disclosure, according to certain embodiments is directed to a method of providing solar-powered illumination, comprising: applying to a surface a window overlay, comprising: a photovoltaic layer with AVT≥70% and PCE≥8%; a thin-film energy storage layer electrically coupled to the photovoltaic layer, with energy density ≥1 Wh/cm$^3$ and AVT≥70%; a illumination layer electrically coupled to the storage layer, emitting ≥100 lm/m$^2$ at efficacy ≥80 lm/W with off-state AVT≥70%; a processor to activate illumination in low-light; an adhesive layer for glass adhesion; protective encapsulation with WVTR<10$^{-6}$ g/m$^2$/day; wherein the overlay is flexible, cuttable, and has total AVT≥40%. generating and storing energy during a period of light; detecting low light; activating the illumination layer; and maintaining an AVT of less than or equal to 40%.

DETAILED DESCRIPTION

Figure 1:
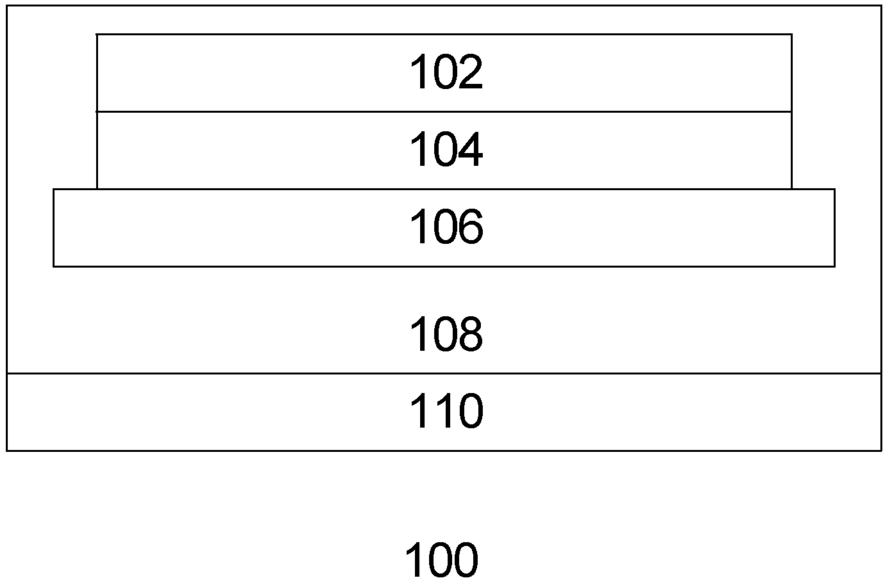
FIG. 1 is a cross-section view of a window overlay, according to one embodiment.

In certain embodiments, the present technology relates to a transparent, adhesive, cut-to-fit window overlay that integrates wavelength-selective photovoltaic cells (≥8% PCE), thin-film energy storage (10-20 Wh/m$^2$), and transparent OLED illumination (100 lm/m$^2$ at ≥80 lm/W) with automatic light-sensor activation. In certain embodiments, the present technology can achieve 40-55% total AVT, generate ~300-500 Wh/m$^2$/day, store energy for ≥8 hours nighttime/emergency lighting, and adhere via optically clear layer. Unlike power-generation-only transparent solar films, the present disclosure can provide self-contained, integrated illumination in a flexible, user-installable format for residential, commercial, and vehicular use. The overlay can be a flexible multilayer film (total thickness of, e.g., 100 to 600 μm, 150 to 550 μm, ~200 to-500 μm, or 250 to 450 μm) applied via peel-and-stick to glass. On certain embodiments, a window overlay can be cuttable for custom fit.

The present disclosure, according to certain embodiments is directed to a transparent, adhesive, cut-to-fit window overlay for solar-powered illumination, comprising: a transparent photovoltaic layer with AVT≥70% and PCE≥8%; a thin-film energy storage layer electrically coupled to the photovoltaic layer, with energy density ≥1 Wh/cm$^3$ and AVT≥70%; a transparent illumination layer electrically coupled to the storage layer, emitting ≥100 lm/m$^2$ at efficacy ≥80 lm/W with off-state AVT≥70%; a light sensor and microcontroller to activate illumination in low-light; an optically clear adhesive layer for glass adhesion; protective encapsulation with WVTR<10$^{-6}$ g/m$^2$/day; wherein the overlay is flexible, cuttable, and has total AVT≥40%. The layers can be electrical coupled though integrated monolithic deposition or external electrical circuits.

Organic Light Emitting Diodes ("OLED") are organic compounds that emit light when electric current passes through them. An OLED's illuminance is measured in lumens per square meter (lm/m$^2$) also known as lux (lx). Average Visible Transmittance ("AVT") is the measure of visible light that passes through a material it is represented in terms of percentage. A higher AVT means a higher percentage of light passes through the material (i.e., lighter tint), whereas a lower AVT indicates a lower percentage of light passes through (i.e., more tint). Power conversion efficiency ("PCE") is the ration of useful output power to input power expressed as a percentage. In solar cells the power in is the light power and the output power is the measure of usable electrical power. Water Vapor Transmittance Rate ("WVTR"), also known as Moisture Vapor Transmittance Rate, is a measure of the passage of water vapor through a substance measured in grams per meter squared per day (g/m$^2$/day). In OLED's the allowable WVTR is measured in 10$^{-6}$ g/m$^2$/day.

In further embodiments the photovoltaic layer comprises wavelength-selective perovskite cells absorbing Ultraviolet (UV) and Near-Infrared (NIR) while transmitting visible light. The transparent photovoltaic layer can comprise, e.g., 100-200 nm wavelength-selective perovskite/organic cells (absorb UV/<400 nm and NIR/>700 nm) and transparent electrodes (PEDOT:PSS or Ag nanowires). The resulting photovoltaic layer can have a PCE of 8-12%, an AVT of 70-85% or 75-82% or 75-80% or 80%, and can generate: ~300-500 $Wh/m^2$/day (AM1.5G, 6 peak sun hours, adjusted for window transmission/angle). During a period of light, the photovoltaic layer can charge the storage layer 8 to 25 $Wh/m^2$, or approximately 10-20 $Wh/m^2$, or 12 to 18 $Wh/m^2$ after losses.

In further embodiments the storage layer is micro-grid patterned solid-state battery or supercapacitor. The storage layer can be thin film energy storage. Thin film energy storage is a form of solid-state batteries or capacitors created by depositing micro-layers of functional materials (e.g., electrodes and electrolytes) directly onto a substrate. Thin-film energy storage compared to traditional batteries has a high energy density, increased durability, and less passive energy discharge. The storage layer can be a solid-state Li-ion battery or graphene supercapacitor (e.g. e.g., 80 to 200 μm or 100-150 μm, micro-grid patterned for transparency) with an energy density of ≥1 $Wh/cm^3$; a storage capacity of 10-20 $Wh/m^2$ or 10-15 Wh/m2 (preferred 10-15); and an AVT of 70-85% or 75-82% or 75-80% or 80%. In further embodiments the storage provides ≥8 hours illumination at ≥100 $lm/m^2$ or 100 to 200 $lm/m^2$.

In further embodiments the illumination layer is an OLED with phosphorescent materials. The transparent illumination layer can be an OLED (100-200 nm, phosphorescent emissive) with an efficacy of ≥80 lm/W; a 100 to 200 $lm/m^2$ output at ~1.25 $W/m^2$; and an off-state AVT of 70-85% or 75-82% or 75-80% or 80%. During the operation state i.e. during the Night or an Emergency a Sensor can activate OLED for ≥8 hours (e.g., 9-12 hours or 10 to 15 hours at 100 to 200 $lm/m^2$ from 15 $Wh/m^2$).

In certain embodiments the overlay further comprises a micro-USB for excess energy output.

In further embodiments the overlay is manufactured via roll-to-roll processing. Roll-to-roll (R2R) processing can comprise solution-printing the photovoltaic layer, vapor-depositing the battery/OLED layers, and laminating encapsulation/adhesive. The result is scalable and low-cost.

In certain embodiments the overlay further comprises a protective top layer, which can be, in various embodiments, a 20 to 100 μm or 50 μm PET with UV-resistant coating (e.g., $SiO_2$) having an AVT of ≥95%.

In certain embodiments the overlay further comprises a Control System comprising a photoresistor+microcontroller in edge strip which activates at <10 lux and requires negligible power (<0.01 $W/m^2$) with a minimal AVT impact (≥99%).

The adhesive layer can be an optically clear adhesive (OCA, e.g., 3M 8171) with a WVTR of $<10^{-6}$ $g/m^2$/day; a AVT of ≥90-92%; adhesion of >5 N/cm; and >10-year durability. Similarly, the encapsulation layer can be thin-film encapsulation ($Al_2O_3$/polymer hybrid), with a WVTR of $<10^{-6}$ $g/m^2$/day; a AVT of ≥90-92%; adhesion of >5 N/cm; and >10-year durability.

In further embodiments the photovoltaic layer comprises perovskite PV (8-12% PCE, ≥70% AVT), the thin-film energy storage layer is a thin-film battery (10-20 $Wh/m^2$, ≥70% AVT), and the transparent illumination layer electrically is an OLED (100 $lm/m^2$ at ≥80 lm/W, ≥70% AVT off).

Total AVT (Average Visible Transmittance) can be calculated multiplicatively (weighted visible spectrum): for example according to one embodiment the AVT≈0.95 (top layer)×0.75-0.85 (photovoltaic layer)×0.70-0.85 (storage layer)×0.70-0.85 (OLED)×0.90-0.92 (adhesive layer)×≥0.99 (control layer)=40-55%. In practicality an AVT of 40-55% is nearly invisible or a light tint.

The overlay can be flexible and cuttable. The overlay can be arranged such all elements are contained in any given portion of the overlay, the result is that when the overlay is cut, the resulting overlay still contains all the elements. The overlay can be cut using scissors, a glass cutter, knife, laser, or the like. Given the thinness of the overlay, it can be flexible such that it can be applied to surfaces with different curvatures.

In further embodiments the processor is at least one of a light sensor or microcontroller.

The present disclosure, according to certain embodiments is directed to a method of providing solar-powered illumination, comprising: applying to a surface a transparent, adhesive, cut-to-fit window overlay for solar-powered illumination, comprising: a transparent photovoltaic layer with AVT≥70% and PCE≥8%; a thin-film energy storage layer electrically coupled thereto, with energy density ≥1 $Wh/cm^3$ and AVT≥70%; a transparent illumination layer electrically coupled to the storage layer, emitting ≥100 $lm/m^2$ or 100 to 200 $lm/m^2$ at efficacy ≥80 lm/W with off-state AVT≥70%; a light sensor and microcontroller to activate illumination in low-light; an optically clear adhesive layer for glass adhesion; protective encapsulation with WVTR<$10^{-6}$ $g/m^2$/day; wherein the overlay is flexible, cuttable, and has total AVT≥40%; generating and storing energy during a period of light; detecting low light; activating the illumination layer; maintaining an AVT of less than or equal to 40%.

In further embodiments a method further comprises providing emergency lighting during outages. In addition to emergency lighting, the embodiments of the present disclosure can be applied in many different applications. For example, for vehicles, such as cars, boats, trains, and aircraft, in residential homes, in stained glass windows (allowing them to be seen at night and not obstructed during the day), or commercial structures.

FIG. 1 is a cross-sectional view of a window overlay 100 according to one embodiment. The overlay comprises a photovoltaic layer 102, an energy storage layer 104, an illumination layer 106, an adhesive layer 110, and a protective encapsulation 108.

Figure 2:
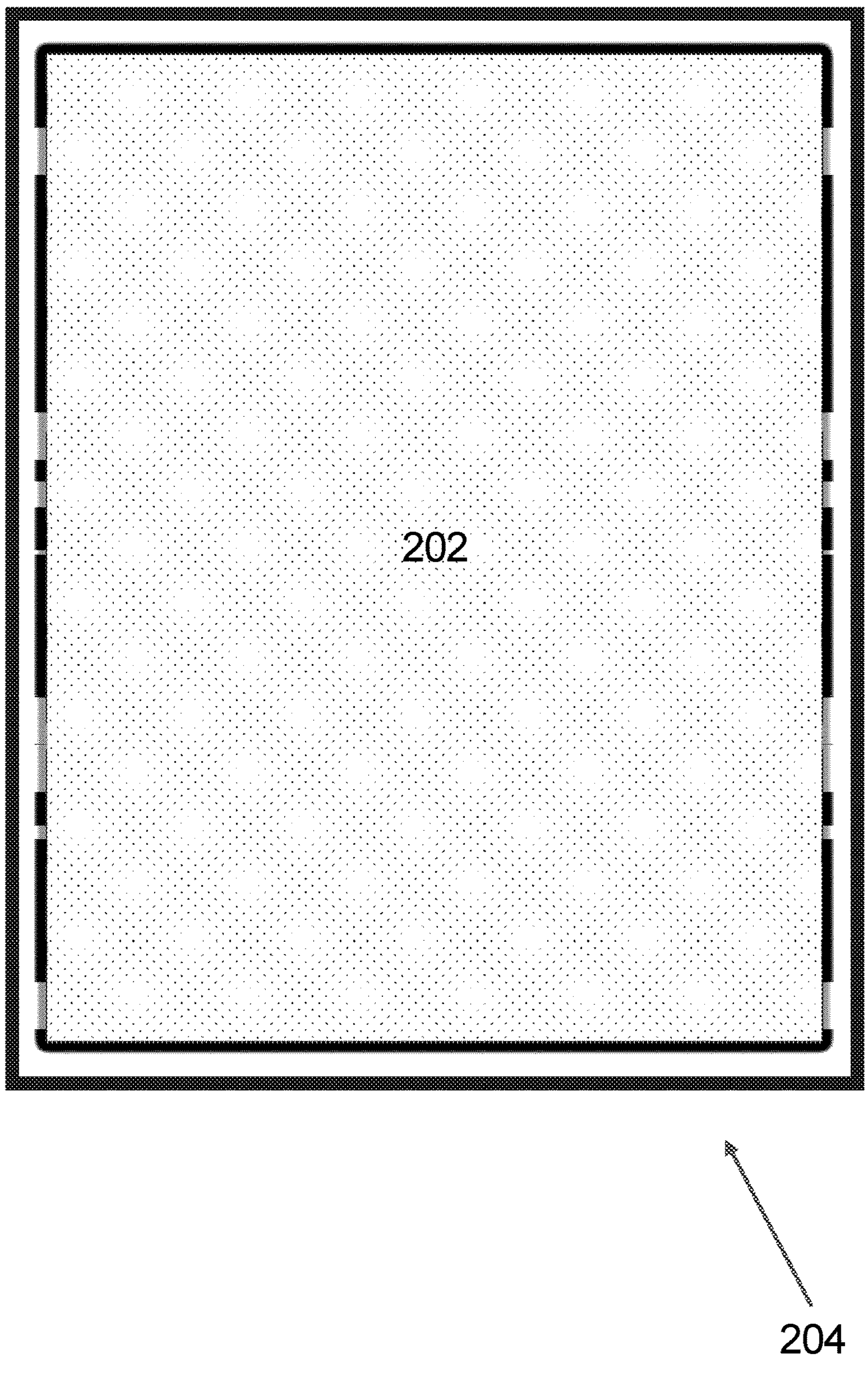
FIG. 2 is a perspective view of a window and window overlay, according to one embodiment.

FIG. 2 is a perspective view of overlay 202 on window 204 at night, showing diffuse illumination.

Figure 3:
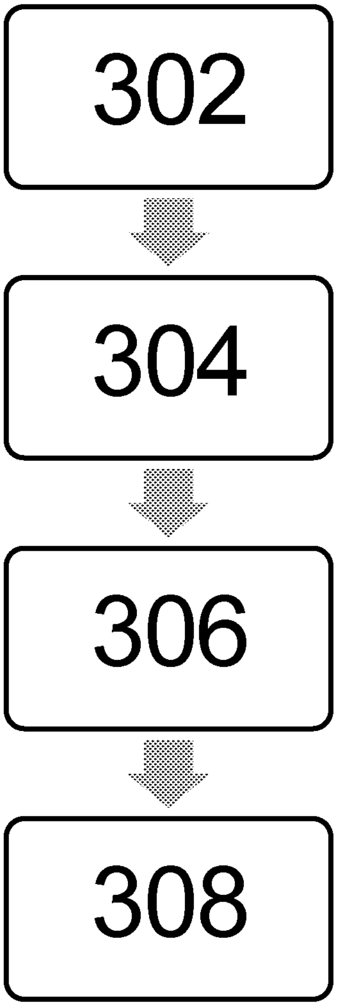
FIG. 3 is a schematic of energy flow for a window overlay, according to one embodiment.

FIG. 3 is an electrical schematic of the energy flow according to one embodiment. The energy flow comprises photovoltaic layer converting light into energy 302, a storage layer storing the energy 304, a processor activating an illumination layer 306, and an illumination layer using the energy to generate light 308.

Unless specified otherwise, “first,” “second,” “top,” “bottom” or the like are not intended to imply a temporal aspect, a spatial aspect, or an ordering. Rather, such terms are merely used as identifiers, names, etc. for features, elements, and items, etc., e.g., a first object and a second object generally correspond to object A and object B or two different or two identical objects or the same object.

Moreover, “example” and “e.g.,” are used herein to mean serving as an example, instance, or illustration, and not necessarily as advantageous. As used herein, measurements of any dimension can be modified to fit particular applications or environments.

In addition, “a” and “an” as used in this application mean “one or more” unless specified otherwise or clear from context to be directed to a singular form. Also, at least one of A and B or the like generally means A or B or both A and B. “Or” is used to indicate an alternative, to connect different possibilities, or all possibilities, i.e., it can be inclusive or exclusive. Furthermore, to the extent that “includes”, “having”, “has”, “with”, or variants thereof are used in either the detailed description or the claims. Such terms are intended to be inclusive in a manner similar to the term “comprising”.

As used in the application, “transparent” means a material that allows light to pass through such that the objects viewed through the material are visible with limited distortion (as opposed to opaque). As used in the application, “tint” means the shade, or darkness of a material. “Transparent” is not a description of the “tint” of a material and vice versa.

As used in this application, “module”, “processor”, “sensor,” “system”, “interface” or the like are generally intended to refer to a computer-related or scientific instrument related article, either hardware, a combination of hardware and software, software, or software in execution, e.g., a device can be, but is not limited to being, a process running on a processor, a processor, an object, an executable, a thread of execution, a program, a sensor, and signal producing article, a signal producing article coupled to a signal detecting article, with software, a sensor or a computer. By way of illustration, both an application running on an article and the article can be a device. One or more devices can reside within a process or thread of execution, and a device can be localized on one processor or distributed between two or more processors.

The foregoing merely illustrates the principles of the disclosure. Various modifications and alterations to the described embodiments will be apparent to those skilled in the art in view of the teachings herein. It will thus be appreciated that those skilled in the art will be able to devise numerous systems, arrangements, manufacture and methods which, although not explicitly shown or described herein, embody the principles of the disclosure and are thus within the spirit and scope of the disclosure.

The invention claimed is:

1. A window overlay, comprising:

a photovoltaic layer with AVT≥70% and PCE≥8%;

a thin-film energy storage layer electrically coupled to the photovoltaic layer, with energy density ≥1 $Wh/cm^3$ and AVT≥70%;

an illumination layer electrically coupled to the storage layer, emitting ≥100 $lm/m^2$ at efficacy ≥80 lm/W with off-state AVT≥70%;

a processor to activate illumination in low-light;

an adhesive layer for glass adhesion;

protective encapsulation with WVTR<$10^{-6}$ $g/m^2$/day; and wherein the overlay is flexible, cuttable, and has total AVT≥40%.

2. The overlay of claim 1, wherein the photovoltaic layer comprises wavelength-selective perovskite cells absorbing UV and NIR while transmitting visible light.

3. The overlay of claim 1, wherein the storage layer is a micro-grid patterned solid-state battery or a supercapacitor.

4. The overlay of claim 1, wherein the illumination layer is an OLED with phosphorescent materials.

5. The overlay of claim 1, wherein the storage layer provides 8 hours illumination at 100 $lm/m^2$.

6. The overlay of claim 1, further comprising a micro-USB for excess energy output.

7. The overlay of claim 1, manufactured via roll-to-roll processing.

8. The overlay of claim 1, wherein the photovoltaic layer is perovskite PV (8-12% PCE, ≥70% AVT), the thin-film energy storage layer is a thin-film battery (10-20 $Wh/m^2$, ≥70% AVT), and the transparent illumination layer electrically is an OLED (100 $lm/m^2$ at ≥80 lm/W, ≥70% AVT off).

9. The overlay of claim 1, wherein the processor is at least one of a light sensor or a microcontroller.

10. A method of providing solar-powered illumination, comprising:

applying to a surface a window overlay, comprising:

a photovoltaic layer with AVT≥70% and PCE≥8%;

a thin-film energy storage layer electrically coupled to the photovoltaic layer, with energy density ≥1 $Wh/cm^3$ and AVT≥70%;

an illumination layer electrically coupled to the storage layer, emitting ≥100 $lm/m^2$ at efficacy ≥80 lm/W with off-state AVT≥70%;

a processor to activate illumination in low light;

an adhesive layer for glass adhesion;

protective encapsulation with WVTR<$10^{-6}$ $g/m^2$/day;

wherein the overlay is flexible, cuttable, and has total AVT≥40%;

generating and storing energy during a period of light;

detecting low light;

activating the illumination layer; and maintaining an AVT of less than or equal to 40%.

11. The method of claim 10, further comprising providing emergency lighting during outages.

* * * * *